United States Patent [19]

Iijima et al.

[11] Patent Number: 5,037,800
[45] Date of Patent: Aug. 6, 1991

[54] METHOD OF DRAWING GLASS ENCASED SUPERCONDUCTIVE OXIDE CORE

[75] Inventors: Kenzaburou Iijima; Toshiharu Hoshi, both of Hamamatsu, Japan

[73] Assignee: Yamaha Corporation, Japan

[21] Appl. No.: 449,286

[22] Filed: Dec. 5, 1989

Related U.S. Application Data

[63] Continuation of Ser. No. 172,470, Mar. 24, 1988, abandoned.

[30] Foreign Application Priority Data

Apr. 11, 1987 [JP] Japan .................. 62-89250
Jun. 19, 1987 [JP] Japan .................. 62-152906

[51] Int. Cl.$^5$ .................. H01B 12/00; H01L 39/12
[52] U.S. Cl. .................. 505/1; 505/725; 505/740; 65/311; 65/3.2; 65/13; 65/102; 264/61
[58] Field of Search .................. 65/3.11, 3.2, 13, 102; 505/1, 704, 701, 730, 740, 733, 800, 813, 818, 821, 822, 823, 866, 915, 916, 918, 930; 264/56, 60, 61, 112, 174, 164, 165

[56] References Cited

U.S. PATENT DOCUMENTS

| 3,362,803 | 1/1968 | Dannohl | 65/13.2 |
| 3,764,725 | 10/1973 | Kafka | 174/29 |
| 4,152,386 | 5/1979 | Winter | 505/822 |
| 4,693,865 | 9/1987 | Goto | 65/3.2 |

OTHER PUBLICATIONS

Chem. Abstracts 106:167380t; 10/1986, Tanaka.
Chem. Abstracts 84:143787g, 6/1975, Fischer.
Luhman, T.; J. Appl. Phys. 49(2), 2-1978, 936-938.
Jin, S. Appl. Phys. Lett. 51(12), 9-21-1987, 943-945.
Jin. S.; Materials Research Society, Apr. 21-24, 1987, Anaheim Calif.; "Fabrication of 94K Superconducting Coils".
Yamada Y., Japanese J. Appl. Physics 26(5), 5-1987, L865-L866.

*Primary Examiner*—Richard V. Fisher
*Assistant Examiner*—John J. Bruckner
*Attorney, Agent, or Firm*—Lerner, David, Littenberg, Krumholz & Mentlik

[57] ABSTRACT

A sintered elongated core made of a ceramic type superconductive material consisting essentially of $(R_xBa_{(1-x)})_3Cu_2O_z$ in which R is Sc, Y La, Ho, Dy or Eu; x is in the range of from 0.3 to 0.8; and z is in the range of from 6 yo 7, is encased in glass and then heated, stretched and drawn.

6 Claims, 1 Drawing Sheet

METHOD OF DRAWING GLASS ENCASED SUPERCONDUCTIVE OXIDE CORE

This is a continuation of application Ser. No. 07/172,470 filed 3/24/88, now abandoned.

BACKGROUND OF THE INVENTION

The present invention relates to an improved process for producing a superconductive wire, and more particularly relates to improvement in production of fine superconductive wires used, for example, for superconductive coils.

Conventional production of fine superconductive wires mostly relies on extrusion of superconductive alloy ingot such as hot extrusion and hydrostatic extrusion. Nb-Ti alloys are, for example, suited for such a manner of production. This conventional process, however, is not applicable to production from superconductive materials which are quite unsuited for extrusion. Thus, despite recent significant development in ceramic type materials which exhibit high superconductivity at liquid nitrogen temperatures, utilization of the ceramic type material is quite limited in production of fine superconductive wires.

SUMMARY OF THE INVENTION

It is the basic object of the present invention to promote use of ceramic type superconductive material in production of fine superconductive wires used for electric and electronic appliances.

In accordance with the basic aspect of the present invention, an elongated block is formed from at least a sintered core of a ceramic type superconductive material, and the elongated block is longitudinally stretched at its one end into a fine wire through heat melting of the sintered core.

DESCRIPTION OF THE PREFERRED EMBODIMENT

Figure 1:
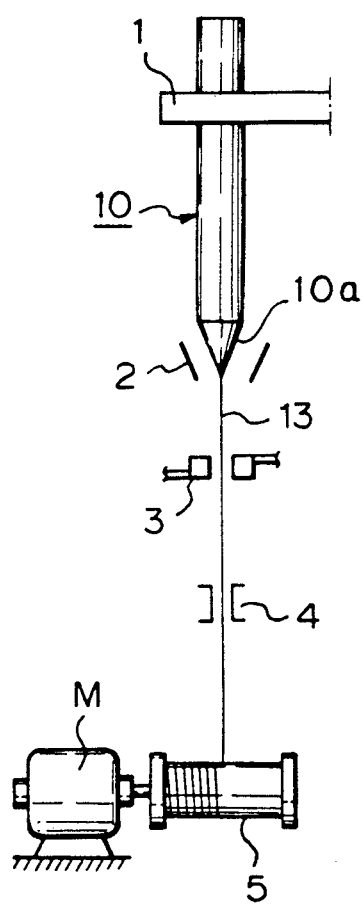
FIG. 1 is a schematic view of one example of the equipment for performing one embodiment of the process in accordance with the present invention.

An equipment for performing the process of the present invention is shown in FIG. 1, in which the equipment includes a supporting unit 1 driven for vertical movement by a proper drive unit (not shown) and carrying an elongated block 10. A heating system 2 is arranged below the supporting unit 1 facing the lower end 10a of the elongated block 10. Further below the heating system 2, is arranged a cooling system 3 facing the path of travel of a fine wire 13 to be formed from the elongated block 10 by means of stretching. The fine wire 13 is led, via an intermediate guide 4, to a take-up unit 5 driven for rotation by a drive motor 5 set on the floor.

Figure 2:
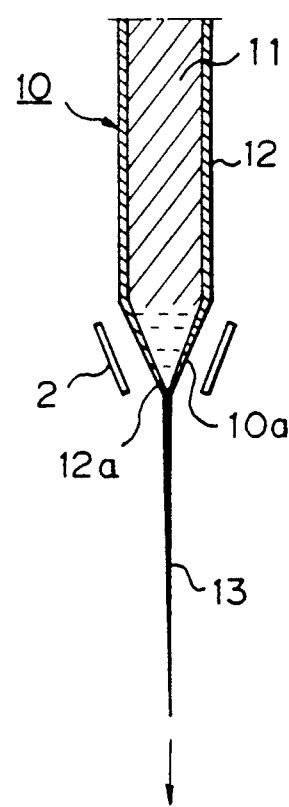
FIG. 2 is a side sectional view of the elongated block used for production by the process of the present invention.

As shown in FIG. 2, the elongated block 10 includes a rod-like sintered core 11 made of a ceramic type superconductive material such as $(Y_{0.5}Ba_{0.5})_3Cu_2O_7$. The sintered core 11 is encased in a tubular glass sheath 12 having a conical lower end 12a. The elongated block 10 is carried by the supporting system 1 with its lower end 10a located near the heating system 2. Through this end heating, the sintered core 11 is molten with concurrent softening of the glass sheath 12 and the softened lower end 12a of the glass sheath 12 is stretched downwards into the fine wire 13 as shown with an arrow. The fine wire 13 is collected on the take-up unit 5 after cooling by the cooling system 3. The glass component on the obtained fine wire 13 is removed by means of proper chemical treatment.

The sintered core 11 preferably has a cylindrical configuration and its diameter is preferably in a range from 10 to 20 mm. In addition to the above-described $(Y_{0.5}Ba_{0.5})_3Cu_2O_7$, the sintered core 11 may be made of any ceramic type superconductive material having a general composition $(R_xBa_{1-x})_3Cu_2O_z$ in which R is Sc, Y, La, Ho, Dy or Eu; X is in a range from 0.3 to 0.8; and Z is in a range from 6 to 7.

Heating temperature by the heating system is selected in reference to the viscosity of the glass sheath 12 rather than the melting point of the sintered core 11. More specifically, the heating temperature is selected so that the viscosity of the heated glass should be in a range from $10^2$ to $10^6$ poise. When the viscosity falls short of $10^2$ poise, excessive melting of the sintered core 11 would cause breakage of the fine wire 13 during stretching. Any viscosity above $10^6$ poise would also cause like breakage due to hardness of the sintered core. Silicate glass and high silicon glass is preferably used for the glass sheath 12.

The heating system 2 may employ either laser heating or SiC galvanization heating. Taking-up of the fine wire 13 is carried out preferably at a speed in a range from 100 to 800 m/min. Cooling is carried out usually in a water bath.

The glass component on the produced fine wire 13 is carried out by means of chemical treatment with molten caustic soda or hydrogenfluoride solution.

EXAMPLES

A test production plant was constructed with the equipment speed and superconductive wires were produced at various take-up speed by the process of the present invention. The test results are as follows:

TABLE 1

| Take-up speed in m/min | Diameter of the wire in $\mu$m |
| --- | --- |
| 100 | 32 |
| 300 | 24 |
| 500 | 20 |
| 800 | 15 |

In the case of the above-test, the elongated block was made up of a sintered core and a glass sheath. For confirmation purposes, the elongated block made of a sintered core only was processed in the same way. The following results were obtained.

TABLE 2

| Take-up speed in m/min | Diameter of the wire in $\mu$m |
| --- | --- |
| 100 | 39 |
| 300 | 27 |
| 500 | 23 |
| 800 | 18 |

It was thus confirmed that the process of the present invention is feasible even without use of a glass sheath for the elongated block, admittedly a little larger in diameter of the product. Use of the glass sheath, however, has additional advantages. Viscosity of highly extensible glass lowers the possibility of wire breakage during stretching under heat application. Covering of the sintered core with the glass sheath during stretching shields the sintered core against evil reaction with the environmental air.

We claim:

1. A process for producing a superconductive wire from a sintered elongated core consisting of copper oxide based ceramic superconductive material, said process comprising providing a sintered elongated core made of a ceramic superconductive material consisting essentially of $(R_xBa_{(1-x)})_3 Cu_2O_z$ in which R is Sc, Y, La, Ho, Dy or Eu; x is in the range of from 0.3 to 0.8; and z is in the range of from 6 to 7, encasing said sintered elongated core in a sheath of glass material to provide a glass coated preform, heating the preform at one end thereof to a temperature whereby the viscosity of the glass material is greater than $10^2$ and up to about $10^6$ poise and said ceramic superconductive material has reached at least its melt temperature, and stretching and drawing the heated end of the preform into a fine wire of said superconductive material coated with said glass material.

2. The process as claimed in claim 1, further comprising the step of cooling said fine wire during a late stage of said stretching and drawing.

3. The process as claimed in claim 1, wherein said sintered elongated core has a cylindrical configuration.

4. The process as claimed in claim 3, wherein the diameter of said sintered elongated core is in a range from 10 to 20 mm.

5. The process as claimed in claim 1, wherein said fine wire is taken up at a speed in a range from 100 to 800 m/min.

6. The process as claimed in claim 1, wherein said sheath has a conical configuration at one end thereof.

* * * * *